(12) United States Patent
Im et al.

(10) Patent No.: US 11,011,650 B2
(45) Date of Patent: May 18, 2021

(54) THIN-FILM TRANSISTOR HAVING HYDROGEN-BLOCKING LAYER AND DISPLAY APPARATUS INCLUDING THE SAME

(71) Applicant: LG Display Co., Ltd., Seoul (KR)

(72) Inventors: Seoyeon Im, Paju-si (KR); HeeSung Lee, Incheon (KR); SeungJin Kim, Paju-si (KR); SungKi Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/058,737

(22) Filed: Aug. 8, 2018

(65) Prior Publication Data

US 2019/0140101 A1 May 9, 2019

(30) Foreign Application Priority Data

Nov. 9, 2017 (KR) .......................... 10-2017-0148778

(51) Int. Cl.
*H01L 29/786* (2006.01)
*H01L 29/24* (2006.01)
(Continued)

(52) U.S. Cl.
CPC .. *H01L 29/78696* (2013.01); *H01L 21/02422* (2013.01); *H01L 21/02483* (2013.01);
(Continued)

(58) Field of Classification Search
CPC ......... H01L 21/02483; H01L 21/02472; H01L 21/02554; H01L 21/02565; H01L 21/385;
(Continued)

(56) References Cited

U.S. PATENT DOCUMENTS

2014/0138683 A1 5/2014 Yamazaki et al.
2014/0154837 A1* 6/2014 Yamazaki ........... H01L 29/7869
438/104
(Continued)

FOREIGN PATENT DOCUMENTS

KR 2015-0061076 A 6/2015
KR 2017-0024130 A 3/2017

OTHER PUBLICATIONS

Jay Lewis., Material challenge for flexible organic devices, Materials Today, vol. 9, Issue 4, Apr. 2006, pp. 38-45.
(Continued)

*Primary Examiner* — Yu Chen
(74) *Attorney, Agent, or Firm* — Polsinelli PC

(57) ABSTRACT

A thin-film transistor is disclosed. The thin-film transistor includes an oxide semiconductor layer disposed on a substrate, a gate electrode disposed so as to overlap at least a portion of the oxide semiconductor layer and isolated from the oxide semiconductor layer, a source electrode connected to the oxide semiconductor layer, and a drain electrode connected to the oxide semiconductor layer and spaced apart from the source electrode, wherein the oxide semiconductor layer includes a first sub layer disposed on the substrate, a second sub layer disposed on the first sub layer, and a third sub layer disposed on the second sub layer, the second sub layer has larger resistance than the first sub layer and the third sub layer and lower carrier concentration than the first sub layer and the third sub layer, the first sub layer has higher hydrogen concentration than the second sub layer and the third sub layer, and each of the first sub layer and the second sub layer has crystallinity.

16 Claims, 10 Drawing Sheets

(51) Int. Cl.
- *H01L 21/385* (2006.01)
- *H01L 27/12* (2006.01)
- *H01L 29/66* (2006.01)
- *H01L 21/02* (2006.01)
- *H01L 29/04* (2006.01)
- *H01L 51/00* (2006.01)
- *H01L 27/32* (2006.01)
- *G02F 1/1368* (2006.01)
- *G02F 1/1362* (2006.01)

(52) U.S. Cl.
CPC .. *H01L 21/02502* (2013.01); *H01L 21/02516* (2013.01); *H01L 21/02565* (2013.01); *H01L 21/02592* (2013.01); *H01L 21/385* (2013.01); *H01L 27/127* (2013.01); *H01L 27/1225* (2013.01); *H01L 29/24* (2013.01); *H01L 29/247* (2013.01); *H01L 29/66969* (2013.01); *H01L 29/7869* (2013.01); *H01L 29/78603* (2013.01); *H01L 29/78606* (2013.01); *H01L 29/78633* (2013.01); *H01L 29/78693* (2013.01); *G02F 1/1368* (2013.01); *G02F 1/13685* (2021.01); *G02F 1/136209* (2013.01); *G02F 2202/10* (2013.01); *H01L 27/3272* (2013.01); *H01L 29/04* (2013.01); *H01L 29/78618* (2013.01); *H01L 51/0097* (2013.01); *H01L 2251/5338* (2013.01)

(58) Field of Classification Search
CPC ........... H01L 29/7869; H01L 29/78693; H01L 29/78696; H01L 29/78618; H01L 29/1054; H01L 21/42
See application file for complete search history.

(56) References Cited

U.S. PATENT DOCUMENTS

| | | | |
|---|---|---|---|
| 2015/0097181 A1* | 4/2015 | Yamazaki | H01L 29/78696 257/43 |
| 2015/0243738 A1* | 8/2015 | Shimomura | H01L 29/24 257/43 |
| 2017/0162713 A1* | 6/2017 | Matsumoto | H01L 27/1225 |
| 2018/0182870 A1* | 6/2018 | Hosaka | H01L 21/47635 |

OTHER PUBLICATIONS

Ok et al., The effects of buffer layers on the performance and stability of flexible InGaZnO thin film transistors on polyimide substrates, Appl. Phys. Lett. 104, 063508 (2014).

* cited by examiner

THIN-FILM TRANSISTOR HAVING HYDROGEN-BLOCKING LAYER AND DISPLAY APPARATUS INCLUDING THE SAME

CROSS REFERENCE TO RELATED APPLICATION

This application claims the priority of Korean Patent Application No. 10-2017-0148778 filed in the Republic of Korea on Nov. 9, 2017, which is hereby incorporated by reference in its entirety.

BACKGROUND OF THE DISCLOSURE

Field of the Disclosure

The present disclosure relates to a thin-film transistor having a hydrogen-blocking layer, a method of manufacturing the thin-film transistor, and a display apparatus including the thin-film transistor.

Description of the Background

In the field of electronic equipment, a transistor has been widely used as a switching device or a driving device. In particular, a thin-film transistor has been widely used as a switching device of a display apparatus, such as a liquid crystal display apparatus or an organic light-emitting display apparatus, since the thin-film transistor can be manufactured on a glass substrate or a plastic substrate.

Based on a material constituting an active layer, the thin-film transistor may be classified as an amorphous silicon thin-film transistor, in which amorphous silicon is used as the active layer, a polycrystalline silicon thin-film transistor, in which polycrystalline silicon is used as the active layer, or an oxide semiconductor thin-film transistor, in which an oxide semiconductor is used as the active layer.

The amorphous silicon thin-film transistor (a-Si TFT) has advantages in that manufacturing time is short and the manufacturing cost is low, since the amorphous silicon is deposited within a short time in order to form the active layer. However, the amorphous silicon thin-film transistor has disadvantages in that the amorphous silicon thin-film transistor has low Hall mobility, whereby the current-driving ability of the amorphous silicon thin-film transistor is not good, and that the threshold voltage of the amorphous silicon thin-film transistor is changed, whereby the use of the amorphous silicon thin-film transistor in an active matrix organic light-emitting device (AMOLED) is limited.

The polycrystalline silicon thin-film transistor (poly-Si TFT) is manufactured by depositing and crystallizing amorphous silicon. Since the process of crystallizing amorphous silicon is required in order to manufacture the polycrystalline silicon thin-film transistor, the number of processes is increased, with the result that manufacturing cost is increased. In addition, since the crystallizing process is performed at a high process temperature, it is difficult to apply the polycrystalline silicon thin-film transistor to a large-sized apparatus. Furthermore, it is difficult to secure the uniformity of the polycrystalline silicon thin-film transistor due to the polycrystalline properties thereof.

For the oxide semiconductor thin-film transistor (oxide semiconductor TFT), an oxide constituting the active layer may be deposited at a relatively low temperature, the Hall mobility of the oxide semiconductor thin-film transistor is high, and a change in the resistance of the oxide semiconductor thin-film transistor is great depending on the content of oxygen, whereby desired physical properties of the oxide semiconductor thin-film transistor are easily obtained. In addition, the oxide semiconductor thin-film transistor is advantageous in the realization of a transparent display, since the oxide semiconductor is transparent due to the properties of the oxide. However, oxygen vacancy occurs in the oxide semiconductor due to the permeation of hydrogen caused by contact of the oxide semiconductor with an insulation layer or a passivation layer, whereby the reliability of the oxide semiconductor may be reduced.

In particular, a plastic substrate, such as a polyimide (PI) substrate, contains a large amount of hydrogen. Therefore, in the case in which an oxide semiconductor layer is formed on a flexible substrate, the oxide semiconductor layer can be damaged by a large amount of hydrogen discharged from the plastic substrate. In order to prevent this, a buffer layer can be disposed on the plastic substrate, and the oxide semiconductor layer can be formed on the buffer layer. Even in this case, the oxide semiconductor layer can be damaged by hydrogen contained in the buffer layer. For this reason, it is difficult to stably form the oxide semiconductor layer on the plastic substrate, such as a polyimide (PI) substrate. The above described background is disclosed in Korean Patent Application Publication No. 10-2017-0024130 entitled SEMICONDUCTOR DEVICE AND METHOD OF MANUFACTURING THE SAME and Korean Patent Application Publication No. 10-2015-0061076 entitled ARRAY SUBSTRATE AND METHOD OF MANUFACTURING THE SAME.

SUMMARY OF THE DISCLOSURE

The present disclosure has been made in view of the above problems, and is to provide a thin-film transistor including a hydrogen-blocking layer that exhibits an excellent hydrogen-blocking property.

In addition, the present disclosure to provide a thin-film transistor including a hydrogen-blocking layer that exhibits an excellent hydrogen-blocking property and an oxide semiconductor layer that is not damaged even when formed on a plastic substrate, such as a polyimide (PI) substrate.

Moreover, the present disclosure to provide a display apparatus including the thin-film transistor described above.

Further, the present disclosure to provide a flexible display apparatus including the thin-film transistor described above.

In accordance with an aspect of the present disclosure, the above and other objects can be accomplished by the provision of a thin-film transistor including an oxide semiconductor layer disposed on a substrate, a gate electrode disposed so as to overlap at least a portion of the oxide semiconductor layer and isolated from the oxide semiconductor layer, a source electrode connected to the oxide semiconductor layer, and a drain electrode connected to the oxide semiconductor layer and spaced apart from the source electrode, wherein the oxide semiconductor layer includes a first sub layer, a second sub layer and a third sub layer, which are sequentially disposed, the second sub layer has larger resistance than the first sub layer and the third sub layer and lower carrier concentration than the first sub layer and the third sub layer, the first sub layer has higher hydrogen concentration than the second sub layer and the third sub layer, and each of the first sub layer and the second sub layer has crystallinity.

Each of the first sub layer and the second sub layer may have C-axis crystallinity and a wurtzite crystal structure.

The first sub layer and the second sub layer may have the same metal element composition.

The third sub layer may have no C-axis crystallinity.

Each of the first sub layer, the second sub layer, and the third sub layer may include indium (In), gallium (Ga), and zinc (Zn), and the third sub layer may have higher indium (In) concentration (at %) than the first sub layer and the second sub layer.

The content of indium (In), gallium (Ga), and zinc (Zn) in each of the first sub layer and the second sub layer may be set so as to satisfy Equations 1 and 2 below.

$$2 \leq [Ga]/[In] \leq 4 \quad \text{[Equation 1]}$$

$$2 \leq [Zn]/[In] \leq 6 \quad \text{[Equation 2]}$$

In Equations 1 and 2, [Ga] indicates the number of atoms in gallium (Ga), [In] indicates the number of atoms in indium (In), and [Zn] indicates the number of atoms in zinc (Zn).

The first sub layer may have a larger taper angle than the third sub layer.

The second sub layer may have a thickness equivalent to 1 to 10 times the thickness of the first sub layer.

The first sub layer may have a thickness ranging from 5 to 15 nm, and the second sub layer may have a thickness ranging from 15 to 50 nm.

The third sub layer may have a first conductivized portion formed at the region thereof that does not overlap the gate electrode.

The second sub layer may have a second conductivized portion formed at the region thereof that does not overlap the gate electrode so as to contact the first conductivized portion conductivized portion.

The second conductivized portion may not contact the first sub layer.

The substrate may be a plastic substrate.

The thin-film transistor may further include a buffer layer disposed between the substrate and the oxide semiconductor layer and a light-blocking layer disposed between the substrate and the buffer layer so as to overlap the oxide semiconductor layer.

The thin-film transistor may further include a gate insulation film disposed between the oxide semiconductor layer and the gate electrode, wherein the oxide semiconductor layer may be disposed so as to be closer to the substrate than the gate electrode on the basis of the gate insulation film.

The thin-film transistor may further include a gate insulation film disposed between the oxide semiconductor layer and the gate electrode, wherein the gate electrode may be disposed so as to be closer to the substrate than the oxide semiconductor layer on the basis of the gate insulation film.

The first sub layer may be disposed so as to be closer to the substrate than the third sub layer on the basis of the second sub layer.

The third sub layer may be disposed so as to be closer to the substrate than the first sub layer on the basis of the second sub layer.

In accordance with another aspect of the present disclosure, there is provided a display apparatus including a substrate, a thin-film transistor disposed on the substrate, and a first electrode connected to the thin-film transistor, wherein the thin-film transistor includes an oxide semiconductor layer disposed on the substrate, a gate electrode disposed so as to overlap at least a portion of the oxide semiconductor layer and isolated from the oxide semiconductor layer, a source electrode connected to the oxide semiconductor layer, and a drain electrode connected to the oxide semiconductor layer and spaced apart from the source electrode, and wherein the oxide semiconductor layer includes a first sub layer, a second sub layer and a third sub layer, which are sequentially disposed, the second sub layer has larger resistance than the first sub layer and the third sub layer and lower carrier concentration than the first sub layer and the third sub layer, the first sub layer has higher hydrogen concentration than the second sub layer and the third sub layer, and each of the first sub layer and the second sub layer has crystallinity.

Each of the first sub layer and the second sub layer may have C-axis crystallinity and a wurtzite crystal structure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
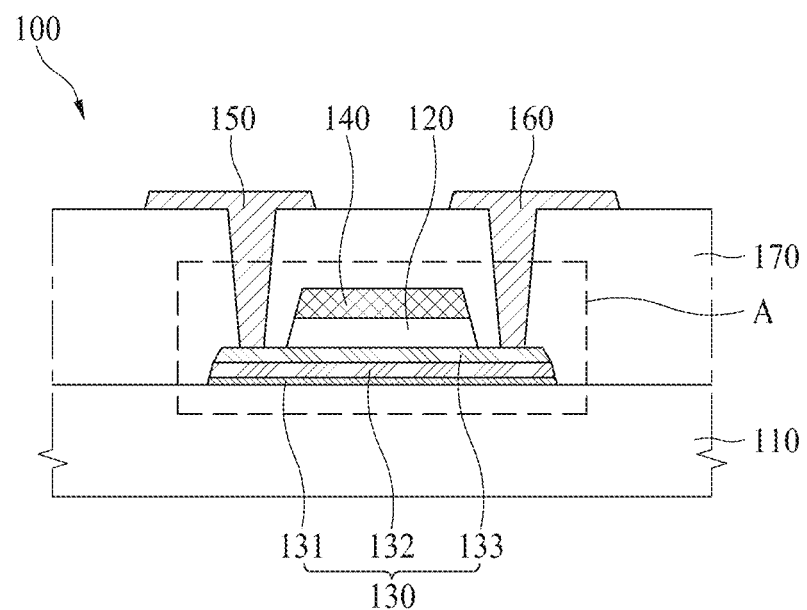
FIG. 1 is a cross-sectional view of a thin-film transistor according to an aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise", "have", and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on", "above", "below", and "next", the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

Spatially relative terms such as "below", "beneath", "lower", "above", or "upper" may be used herein to describe a relationship of a device or an element to another device or another element as shown in the figures. It will be understood that spatially relative terms are intended to encompass different orientations of a device during the use or operation of the device, in addition to the orientation depicted in the figures. For example, if a device in one of the figures is turned upside down, elements described as "below" or "beneath" other elements would then be oriented "above" the other elements. The exemplary term "below" or "beneath" can, therefore, encompass both an orientation of below and above. In the same manner, the exemplary term "above" or "upper" can encompass both an orientation of above and below.

In describing a temporal relationship, for example, when the temporal order is described as "after", "subsequent", "next", and "before", a case which is not continuous may be included, unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction", "second horizontal axis direction", and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, a thin-film transistor and a display apparatus including the same according to aspects of the present disclosure will be described in detail with reference to the accompanying drawings. In the drawings, the same or similar elements are denoted by the same reference numerals even though they are depicted in different drawings.

FIG. 1 is a cross-sectional view of a thin-film transistor 100 according to an aspect of the present disclosure.

The thin-film transistor 100 according to the aspect of the present disclosure includes an oxide semiconductor layer 130 disposed on a substrate 110, a gate electrode 140 disposed so as to overlap at least a portion of the oxide semiconductor layer 130 and isolated from the oxide semiconductor layer 130, a source electrode 150 connected to the oxide semiconductor layer 130, and a drain electrode 160 connected to the oxide semiconductor layer 130 and spaced apart from the source electrode 150.

Glass or plastic may be used as the substrate 110. Transparent plastic that exhibits flexibility, such as polyimide (PI), may be used as the plastic.

In the case in which polyimide (PI) is used as the substrate 110, heat-resistant polyimide, which withstands high temperatures, may be used in consideration of the fact that a high-temperature deposition process is carried out on the substrate 110. In this case, processes, such as deposition and etching, may be carried out in the state in which the polyimide substrate is disposed on a carrier substrate composed of a highly durable material, such as glass, in order to form the thin-film transistor 100.

In addition to the polyimide substrate, other plastic substrates well-known in the art may be used. For example, a polycarbonate (PC) substrate, a polyethersulfone (PES) substrate, a polyethylene naphthalate (PEN) substrate, a polyethylene terephthalate (PET) substrate, or a polystyrene (PS) substrate may be used as the substrate 110 of FIG. 1.

More specifically, a substrate 110 according to an aspect of the present disclosure may include at least one of polyimide (PI), polycarbonate (PC), polyethersulfone (PES), polyethylene naphthalate (PEN), polyethylene terephthalate (PET), or polystyrene (PS).

Such a plastic substrate may be used to manufacture a flexible display apparatus. The thin-film transistor 100 according to the aspect of the present disclosure may be formed on a flexible substrate such that the thin-film transistor can be used as a driving or switching thin-film transistor of a flexible display apparatus.

The plastic substrate contains a larger amount of hydrogen than a glass substrate. During a process of manufacturing the thin-film transistor 100 or during a process of manufacturing a display apparatus 500 or 600, the hydrogen may leak from the plastic substrate, whereby the other components of the thin-film transistor 100 or the display apparatus 500 or 600 may be affected.

For example, the hydrogen contained in the plastic substrate may move to the oxide semiconductor layer 130, and may be coupled to oxygen in the oxide semiconductor layer 130, whereby oxygen vacancy may occur in the oxide semiconductor layer 130, or the oxide semiconductor layer 130 may be conductivized. In the case in which the hydrogen (H) contained in the plastic substrate moves to the oxide semiconductor layer 130, as described above, the oxide semiconductor layer 130 is damaged, whereby the reliability of the thin-film transistor 100 is reduced.

In order to protect the oxide semiconductor layer 130 or the thin-film transistor 100 from hydrogen (H), oxygen ($O_2$), or moisture ($H_2O$) discharged from the plastic substrate or introduced from the outside, a buffer layer (not shown) may be disposed on the substrate 110.

However, the thin-film transistor 100 according to the aspect of the present disclosure has a first sub layer 131 provided in the oxide semiconductor layer 130. The first sub layer 131 serves as a hydrogen-blocking layer, whereby the buffer layer may be omitted.

Referring to FIG. 1, the oxide semiconductor layer 130 is disposed on the substrate 110.

The oxide semiconductor layer includes a first sub layer, a second sub layer and a third sub layer, which are sequentially disposed. For example, the oxide semiconductor layer 130 includes a first sub layer 131 disposed on the substrate 110, a second sub layer 132 disposed on the first sub layer 131, and a third sub layer 133 disposed on the second sub layer 132.

According to an aspect of the present disclosure, a channel of the thin-film transistor 100 is formed in the third sub layer 133. Consequently, the third sub layer 133 is called a channel layer. The third sub layer 133 includes an oxide semiconductor material. For example, the third sub layer 133 may be made of an oxide semiconductor material, such as an InZnO (IZO)-based oxide semiconductor material, an InGaO (IGO)-based oxide semiconductor material, an InSnO (ITO)-based oxide semiconductor material, an InGaZnO (IGZO)-based oxide semiconductor material, an InGaZnSnO (IGZTO)-based oxide semiconductor material, a GaZnSnO (GZTO)-based oxide semiconductor material, or an InSnZnO (ITZO)-based oxide semiconductor material. However, the present disclosure is not limited thereto. The third sub layer 133 may be made of any of other oxide semiconductor materials well-known in the art.

The second sub layer 132 is disposed between the first sub layer 131 and the third sub layer 133 in order to isolate the first sub layer 131 and the third sub layer 133 from each other. The second sub layer 132 serves as a support for supporting the first sub layer 131. In addition, a portion of the region of the second sub layer 132 that is adjacent to the third sub layer 133 may serve as a channel.

The first sub layer 131 serves as a hydrogen-blocking layer for preventing the introduction of hydrogen (H) into the third sub layer 133, which serves as a channel layer. The first sub layer 131 protects the third sub layer 133, which serves as a channel layer, from hydrogen. More specifically, the first sub layer 131 serves as a barrier for blocking hydrogen (H) from being introduced into the third sub layer 133.

The first sub layer 131 and the second sub layer 132 may be made of the same oxide semiconductor material. More specifically, a bulk layer 130B for forming the first sub layer 131 and the second sub layer 132 is formed using the same oxide semiconductor material, and then the first sub layer 131 may be formed by introduction of hydrogen that is discharged from the substrate 110 or introduced from the external environment.

Figure 2A:
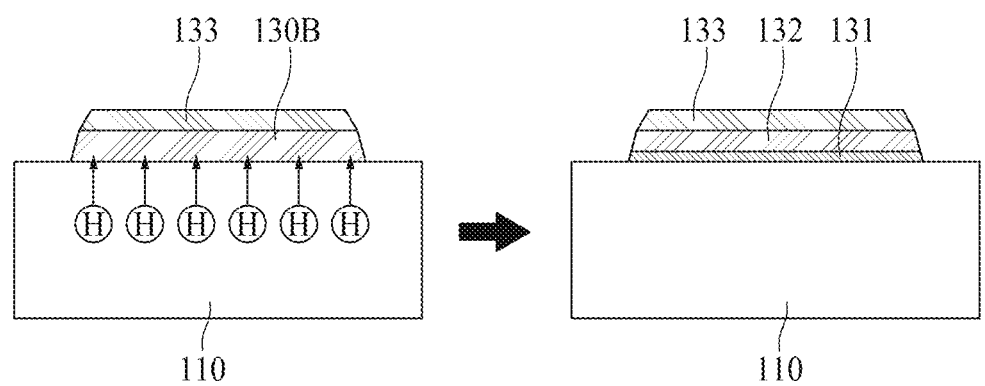
FIGS. 2A and 2B are schematic views showing a process of forming a first sub layer and a second sub layer.
Figure 2B:
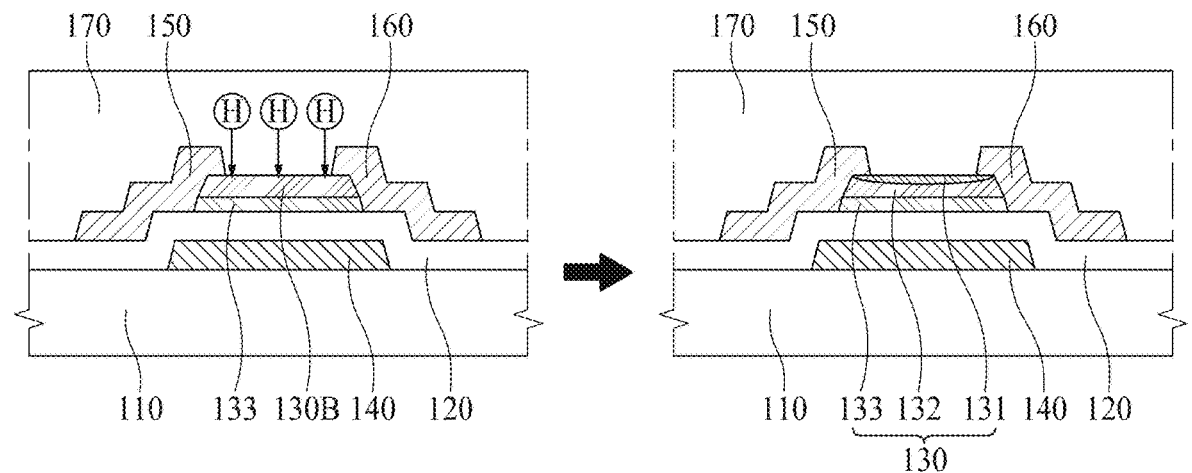

FIGS. 2A and 2B are schematic views showing a process of forming the first sub layer 131 and the second sub layer 132.

Referring to FIG. 2A, first, a bulk layer 130B for forming the first sub layer 131 and the second sub layer 132 is formed using the same oxide semiconductor material. The bulk layer 130B may be formed by deposition and patterning. For example, the bulk layer 130B may be formed by sputter deposition. Alternatively, the bulk layer 130B may be formed by metal organic chemical vapor deposition (MOCVD). The bulk layer 130B formed by metal organic chemical vapor deposition (MOCVD) may have a dense film structure.

Referring to FIG. 2A (the left part thereof), hydrogen (H) discharged from the substrate 110 is introduced into the lower part of the bulk layer 130B during the process of manufacturing the thin-film transistor 100. At this time, hydrogen (H) introduced from the outside or hydrogen (H) discharged from another insulation layer may be introduced into the lower part of the bulk layer 130B. A hydrogen-containing film having a small thickness is formed in the lower part of the bulk layer 130B through the introduction of hydrogen (H), whereby the first sub layer 131 is formed (see the right part of FIG. 2A). As a result, the first sub layer 131 and the second sub layer 132 are distinguished from each other, although the first sub layer 131 and the second sub layer 132 may have same metal element composition mixed in same atomic ratio.

However, the present disclosure is not limited thereto. Referring to FIG. 2B, hydrogen is introduced into the bulk layer 130B from an interlayer insulation film 170, which is a insulation film located on the bulk layer 130B on the basis of the figure. As a result, a hydrogen-containing film having a small thickness may be formed in the upper part of the bulk layer 130B, whereby the first sub layer 131 may be formed.

The first sub layer 131 formed as described above has a stable film structure that is capable of blocking hydrogen. Consequently, the first sub layer 131 may also be referred to as a hydrogen-blocking layer.

According to an aspect of the present disclosure, the second sub layer 132 has larger resistance than the first sub layer 131 and the third sub layer 132, and has lower carrier concentration than the first sub layer 131 and the third sub layer 132.

Specifically, the first sub layer 131 is made of the same oxide semiconductor material as the second sub layer 132, and is completed through the introduction of hydrogen. Consequently, the first sub layer 131 has smaller resistance than the second sub layer 132, and has higher carrier concentration than the second sub layer 132. Meanwhile, the third sub layer 133 serves as a channel layer. In order to serve as a channel layer, the third sub layer 133 is designed to have smaller resistance than the second sub layer 132 and to have higher carrier concentration than the second sub layer 132. To this end, the third sub layer 133 may be made of an oxide semiconductor material different from the oxide semiconductor material of the first sub layer 131 and the second sub layer 132.

In addition, the first sub layer 131 blocks hydrogen from being introduced into the second sub layer 132 and the third sub layer 133, even though the first sub layer 131 is formed through the introduction of hydrogen. Consequently, the first sub layer 131 has higher hydrogen concentration than the second sub layer 132 and the third sub layer 133.

Each of the first sub layer 131 and the second sub layer 132 has crystallinity. More specifically, each of the first sub layer 131 and the second sub layer 132 has C-axis crystallinity and a wurtzite crystal structure. In the case in which the bulk layer 130B for forming the first sub layer 131 and the second sub layer 132, shown in FIGS. 2A and 2B, includes a larger amount of zinc (Zn) than indium (In) based on the number of atoms, and is formed by deposition, such as sputter deposition, at a predetermined temperature, the bulk layer 130B may have C-axis crystallinity and a wurtzite crystal structure. As a result, each of the first sub layer 131 and the second sub layer 132 may also have C-axis crystallinity and a wurtzite crystal structure.

Figure 3:
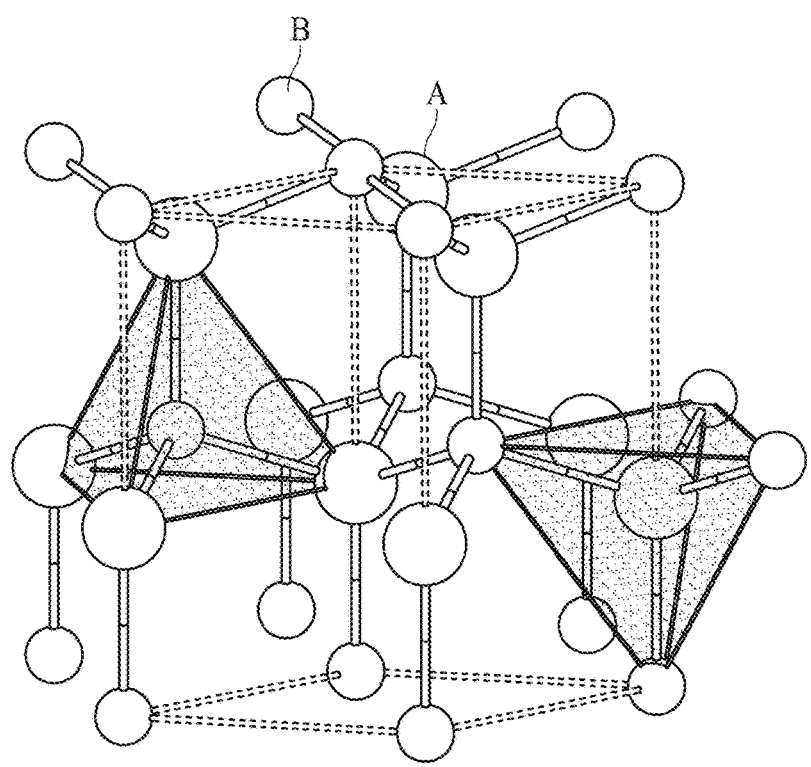
FIG. 3 is a schematic view showing a wurtzite crystal structure.

FIG. 3 is a schematic view showing a wurtzite crystal structure. The wurtzite crystal structure is one of the crystal structures of an A-B type compound, which is a hexagonal lattice in which a tetrahedral formation is formed around each of element A and element B.

The hydrogen (H) introduced into the lower part of the bulk layer 130B, which has C-axis crystallinity and a wurtzite crystal structure, permeates about 5 to 15 nm from the lower surface of the bulk layer 130B, but does not move into the bulk layer 130B any further, whereby a stable film is formed. That is, the hydrogen (H) introduced into the lower part of the bulk layer 130B forms a stable film together with existing components of the bulk layer 130B, whereby the first sub layer 131 is formed.

As a result, the first sub layer 131 may have a thickness ranging from 5 to 15 nm. However, the present disclosure is not limited thereto. The first sub layer 131 may have a thickness of more than 15 nm.

The first sub layer 131, formed as described above, may have a hydrogen concentration equivalent to 10 times or more the hydrogen concentration of the second sub layer 132. More specifically, the first sub layer 131 may have a hydrogen concentration equivalent to 10 to 100 times the hydrogen concentration of the second sub layer 132.

According to an aspect of the present disclosure, the first sub layer 131 and the second sub layer 132 may have the same metal element composition. Referring to FIGS. 2A and 2B, the first sub layer 131 and the second sub layer 132 are formed from the bulk layer 130B, and the first sub layer 131 contains a larger amount of hydrogen than the second sub layer 132. Consequently, the first sub layer 131 and the second sub layer 132 may have the same metal element composition, and the first sub layer 131 and the second sub layer 132 may be simultaneously formed by one-time deposition and patterning.

According to an aspect of the present disclosure, the third sub layer 133 may be amorphous. For example, the third sub layer 133 may have no C-axis crystallinity. Consequently, the third sub layer 133 may be distinguished from the first sub layer 131 and the second sub layer 132, and may exhibit excellent electrical properties, whereby the third sub layer 133 may serve as a channel layer. However, the present disclosure is not limited thereto. The third sub layer 133 may have crystallinity. For example, the third sub layer 133 may be crystalline.

According to an aspect of the present disclosure, each of the first sub layer 131, the second sub layer 132, and the third sub layer 133 may include indium (In), gallium (Ga), and zinc (Zn).

Gallium (Ga) is stably coupled to oxygen, and thus has excellent ability to prevent the permeation of gas. Gallium (Ga) contributes to the stability of a film. In particular, gallium (Ga) may enable the first sub layer 131 to function as a hydrogen-blocking layer, and may enable the second sub layer 131 to function as a stable support.

Zinc (Zn) contributes to the stable formation of a film. An amorphous film or a crystalline film may be easily formed by zinc (Zn). As a result, the oxide semiconductor layer 130 may be maintained in the form of a stable film. In particular, zinc (Zn) enables a stable taper shape to be formed at the edge of the oxide semiconductor layer 130 during a process of patterning the oxide semiconductor layer 130. In the case in which a stable taper shape is not formed at the edge of the oxide semiconductor layer 130, hydrogen or other gases may be introduced through the interface thereof, whereby the oxide semiconductor layer 130 may be damaged.

Indium (In) increases the mobility and the charge density of the oxide semiconductor layer 130. However, indium (In) is weakly coupled to oxygen. In the case in which hydrogen permeates into the oxide semiconductor layer 130, therefore, oxygen that has been coupled to indium (In) is coupled to hydrogen instead of indium (In), whereby oxygen vacancy (O-vacancy) occurs in the oxide semiconductor layer 130.

According to an aspect of the present disclosure, the third sub layer 133 includes indium (In), whereby the third sub layer 133 may sufficiently serve as a channel layer. In addition, the second sub layer 132 may include indium (In) in order to serve as a channel as well as a barrier. In this case, the first sub layer 131, which has the same metal composition as the second sub layer 132, also includes indium (In).

The third sub layer 133, which serves as a main channel layer, has a higher concentration of indium (In) than the first sub layer 131 and the second sub layer 132. Here, the concentration of indium (In) may be expressed as the content ratio of indium (In) to all metal elements that are included in each of the first sub layer 131, the second sub layer 132, and the third sub layer 133. At this time, the content ratio may be expressed as atomic percent (at %), which is based on the number of atoms.

According to an aspect of the present disclosure, since the third sub layer 133 has high mobility and charge density due to high concentration of indium (In), the third sub layer 133 may serve as a main channel layer.

As previously described, indium (In) is weakly coupled to oxygen. In the case in which hydrogen permeates into the oxide semiconductor layer 130, therefore, oxygen vacancy (O-vacancy) occurs in the oxide semiconductor layer 130 due to indium (In). Consequently, the content of indium (In) in the first sub layer 131, which serves as a hydrogen-blocking layer, and the second sub layer 132, which serves as a support, is adjusted to a predetermined range or less, compared to gallium (Ga) and zinc (Zn).

For example, the content of indium (In), gallium (Ga), and zinc (Zn) in each of the first sub layer 131 and the second sub layer 132 may be set so as to satisfy Equations 1 and 2 below.

$$2 \leq [Ga]/[In] \leq 4 \quad \text{[Equation 1]}$$

$$2 \leq [Zn]/[In] \leq 6 \quad \text{[Equation 2]}$$

In Equations 1 and 2, [Ga] indicates the number of atoms in gallium (Ga), [In] indicates the number of atoms in indium (In), and [Zn] indicates the number of atoms in zinc (Zn).

In the case in which the content ratio of gallium (Ga) to indium (In) is less than 2 ($[Ga]/[In]<2$), the hydrogen blocking ability of the first sub layer 131 may be reduced due to the deficiency in the content of gallium (Ga). In the case in which the content ratio of gallium (Ga) to indium (In) is greater than 4 ($[Ga]/[In]>4$), on the other hand, it may be difficult for a portion of the second sub layer 132 to serve as a channel layer due to the deficiency in the content of indium (In).

In the case in which the content ratio of zinc (Zn) to indium (In) is less than 2 ([Zn]/[In]<2), the film stability of each of the first sub layer 131 and the second sub layer 132 may be reduced due to the deficiency in the content of zinc (Zn). As a result, a stable taper is not formed at the edge of each of the first sub layer 131 and the second sub layer 132, whereby hydrogen or other gases may be introduced through the interface between each of the first sub layer 131 and the second sub layer 132 and another layer. In the case in which the content ratio of zinc (Zn) to indium (In) is greater than 4 ([Zn]/[In]>4), on the other hand, it may be difficult for a portion of the second sub layer 132 to serve as a channel layer due to the deficiency in the content of indium (In).

Hereinafter, the oxide semiconductor layer 130 will be described in more detail with reference to FIG. 4.

Figure 4:
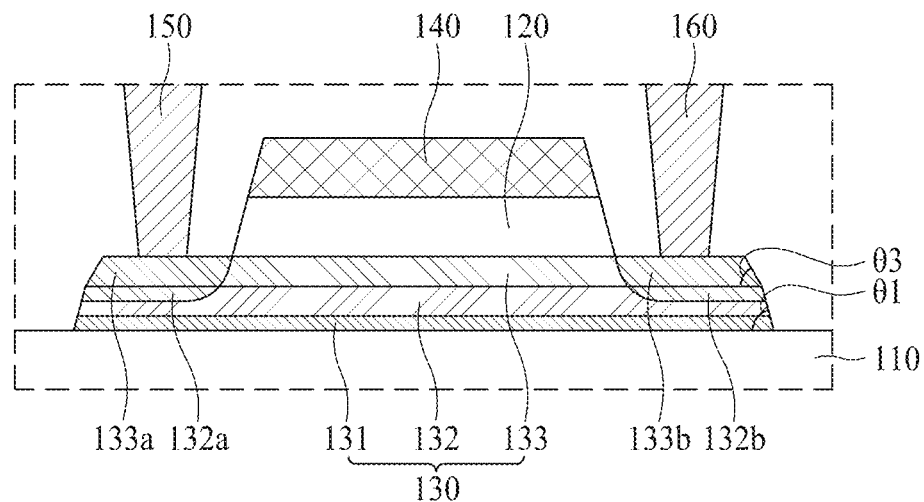
FIG. 4 is an enlarged view showing part A of FIG. 1.

FIG. 4 is an enlarged view showing part A of FIG. 1.

Referring to FIG. 4, the first sub layer 131 has a larger taper angle than the third sub layer 133 ($\theta1>\theta3$). According to an aspect of the present disclosure, the third sub layer 133 includes a larger amount of indium (In) than the first sub layer 131 and the second sub layer 132, whereas the third sub layer 133 includes a smaller amount of zinc (Zn) and gallium (Ga) than the first sub layer 131 and the second sub layer 132. As a result, the third sub layer 133 has a higher etching rate than the first sub layer 131 and the second sub layer 132. Consequently, the taper angle $\theta3$ of the third sub layer 133 is smaller than the taper angle $\theta1$ of the first sub layer 131. Since the third sub layer 133 includes a predetermined amount of zinc (Zn) and gallium (Ga), however, the edge of the third sub layer 133 may have a stable taper shape.

As previously described, the first sub layer 131 and the second sub layer 132 are simultaneously formed by patterning. Consequently, the first sub layer 131 and the second sub layer 132 may have the same taper angle $\theta1$.

According to an aspect of the present disclosure, the third sub layer 133 serves as a channel layer, and a portion of the third sub layer 133 may be conductivized in order to contact the source electrode 150 and the drain electrode 160. More specifically, a portion of the region of the third sub layer 133 that does not overlap the gate electrode 140 may be conductivized. According to an aspect of the present disclosure, the conductivized region of the third sub layer 133 is referred to as a first conductivized portion 133a and 133b. The method of conductivization is not particularly restricted. A portion of the oxide semiconductor layer 130 may be conductivized using any of the well-known conductivization methods. For example, a portion of the oxide semiconductor layer 130 may be conductivized through selective radiation of argon (Ar) plasma.

Referring to FIG. 4, the third sub layer 133 has a first conductivized portion 133a and 133b formed at the region thereof that does not overlap the gate electrode 140. Consequently, a contact property of the third sub layer 133 with the source electrode 150 and the drain electrode 160 may be improved, whereby the third sub layer 133 may smoothly serve as a channel layer.

Referring to FIG. 4, the second sub layer 132 has a second conductivized portion 132a and 132b formed at the region thereof that does not overlap the gate electrode 140 so as to contact the first conductivized portion 133a and 133b. Consequently, the second sub layer 132 may also serve as a channel layer.

Meanwhile, the first sub layer 131 contains a large amount of hydrogen, whereby the conductivity of the first sub layer 131 is high. In the case in which the second conductivized portion 132a and 132b contacts the first sub layer 131, therefore, electrical conduction may be realized between opposite ends of the oxide semiconductor layer 130, whereby the switching function of the thin-film transistor 100 may not be performed. For this reason, the second conductivized portion 132a and 132b is designed so as not to contact the first sub layer 131.

In order for a portion of the second sub layer 132 to serve as a channel layer and at the same time for the second conductivized portion 132a and 132b, which are formed in the second sub layer 132, not to contact the first sub layer 131, it is necessary for the second sub layer 132 to have a predetermined thickness. To this end, the second sub layer 132 may have a thickness ranging from 15 to 50 nm. However, the present disclosure is not limited thereto. The second sub layer 132 may have a thickness of more than 50 nm.

In addition, the second sub layer 132 may have a thickness equivalent to 1 to 10 times the thickness of the first sub layer 131. More specifically, the second sub layer 132 may have a thickness equivalent to 2 to 5 times the thickness of the first sub layer 131. For example, the second sub layer 132 may have a thickness equivalent to 3 to 4 times the thickness of the first sub layer 131.

A gate insulation film 120 is disposed on the oxide semiconductor layer 130. The gate insulation film 120 may include at least one of a silicon oxide or a silicon nitride. The gate insulation film 120 may include an aluminum oxide ($Al_2O_3$).

The gate insulation film 120 may have a single-film structure or a multi-film structure. For example, any one of an aluminum oxide layer, a silicon oxide layer, and a silicon nitride layer may individually form the gate insulation film 120. Alternatively, the aluminum oxide layer, the silicon oxide layer, and the silicon nitride layer may be stacked to form the gate insulation film 120.

Referring to FIG. 1, the gate electrode 140 is disposed on the gate insulation film 120. Specifically, the gate electrode 140 overlaps at least a portion of the oxide semiconductor layer 130 and isolated from the oxide semiconductor layer 130. The structure of the thin-film transistor 100 in which the gate electrode 140 is disposed above the oxide semiconductor layer 130 as shown in FIG. 1 is called a top gate structure. Here, the oxide semiconductor layer 130 is disposed so as to be closer to the substrate 110 than the gate electrode 140 on the basis of the gate insulation film 120.

The gate electrode 140 may include at least one of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chrome (Cr), tantalum (Ta), neodymium (Nd), or titanium (Ti). The gate electrode 140 may have a multi-layer film structure including at least two conductive films that have different physical properties.

The interlayer insulation film 170 is disposed on the gate electrode 140. The interlayer insulation film 170 is composed of a insulation material. Specifically, the interlayer insulation film 170 may be composed of an organic material, an inorganic material, or a stack including an organic material layer and an inorganic material layer.

The source electrode 150 and the drain electrode 160 are disposed on the interlayer insulation film 170. The source electrode 150 and the drain electrode 160 are connected to the oxide semiconductor layer 130 and spaced apart from each other. Referring to FIG. 1, the source electrode 150 and the drain electrode 160 are connected to the oxide semiconductor layer 130 via contact holes formed through the interlayer insulation film 170. More specifically, the source electrode 150 and the drain electrode 160 are connected to the third sub layer 133 of the oxide semiconductor layer 130.

Each of the source electrode 150 and the drain electrode 160 may include at least one of molybdenum (Mo), aluminum (Al), chrome (Cr), gold (Au), titanium (Ti), nickel (Ni), neodymium (Nd), copper (Cu), or an alloy thereof. Each of the source electrode 150 and the drain electrode 160 may be formed so as to have a single layer made of a metal or an alloy of metals, or may be formed so as to have a plurality of layers, such as two or more layers.

The oxide semiconductor layer 130, the gate electrode 140, the source electrode 150, and the drain electrode 160 form the thin-film transistor 100.

Figure 5:
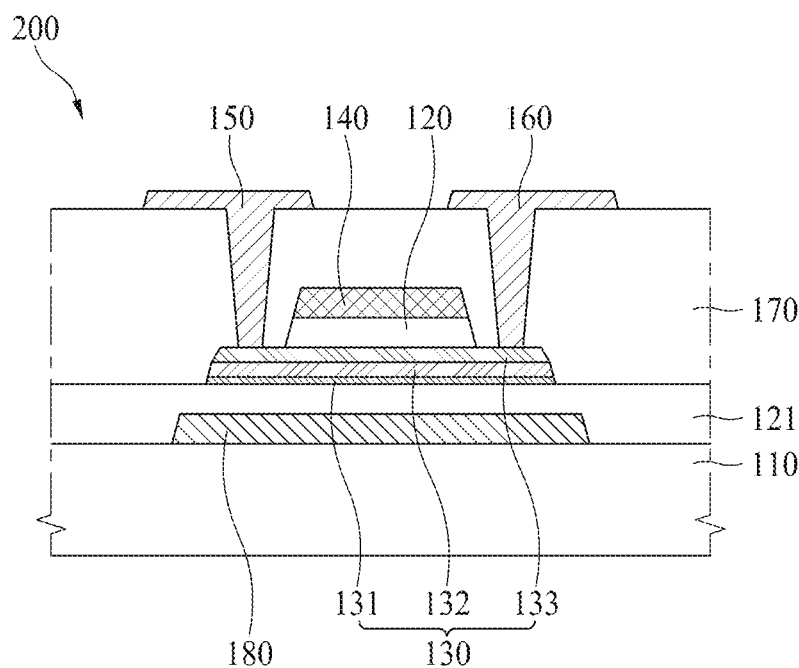
FIG. 5 is a cross-sectional view of a thin-film transistor according to another aspect of the present disclosure.

FIG. 5 is a cross-sectional view of a thin-film transistor 200 according to another aspect of the present disclosure. Hereinafter, a description of the components that have already been described above will be omitted in order to avoid duplication of description.

Compared to the thin-film transistor 100 of FIG. 1, the thin-film transistor 200 of FIG. 5 further includes a light-blocking layer 180 and a buffer layer 121 disposed on the substrate 110. The light-blocking layer 180 overlaps the oxide semiconductor layer 130.

The light-blocking layer 180 blocks the incidence of light onto the oxide semiconductor layer 130 of the thin-film transistor 200 from the outside in order to prevent damage of the oxide semiconductor layer 130 due to external incident light.

In general, the light-blocking layer 180 is made of an electrically conductive material, such as metal. For this reason, the buffer layer 121 is disposed on the light-blocking layer 180 in order to isolate the light-blocking layer 180 and the oxide semiconductor layer 130 from each other. In this case, hydrogen contained in the buffer layer 121 may diffuse into the oxide semiconductor layer 130, whereby oxygen vacancy (O-vacancy) may occur in the oxide semiconductor layer 130, or the oxide semiconductor layer 130 may be conductivized.

In order to prevent the occurrence of oxygen vacancy in the oxide semiconductor layer 130 due to hydrogen or to prevent the oxide semiconductor layer 130 from being conductivized due to hydrogen, the thin-film transistor 200 according to the aspect of the present disclosure includes a first sub layer 131. Specifically, the oxide semiconductor layer 130 includes a first sub layer 131, a second sub layer 132, and a third sub layer 133. The first sub layer 131 is disposed to be in contact with the buffer layer 121. Here, the first sub layer 131 is a hydrogen-blocking layer.

Figure 6A:
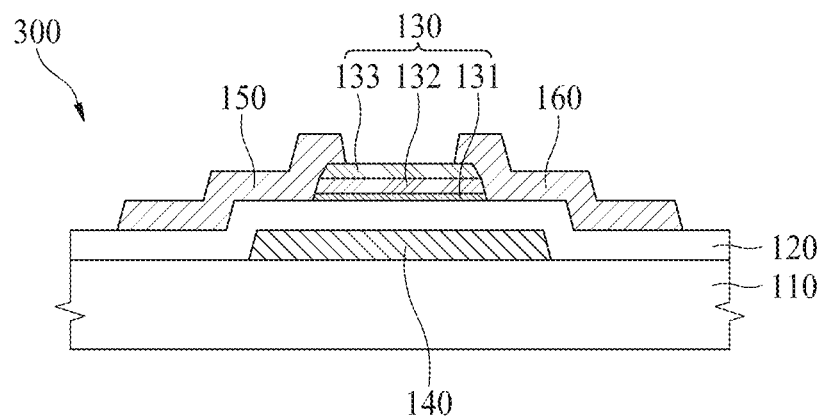
FIGS. 6A and 6B are cross-sectional views of thin-film transistors according to other aspects of the present disclosure.

FIG. 6A is a cross-sectional view of a thin-film transistor 300 according to another aspect of the present disclosure.

The thin-film transistor 300 of FIG. 6A includes a gate electrode 140 disposed on a substrate 110, an oxide semiconductor layer 130 disposed so as to overlap at least a portion of the gate electrode 140 and isolated from the gate electrode 140, a gate insulation film 120 disposed between the gate electrode 140 and the oxide semiconductor layer 130, a source electrode 150 connected to the oxide semiconductor layer 130, and a drain electrode 160 connected to the oxide semiconductor layer 130 and spaced apart from the source electrode 150.

The structure in which the gate electrode 140 is disposed below the oxide semiconductor layer 130 as shown in FIG. 6A is called a bottom gate structure. Here, the oxide semiconductor layer 130, the gate electrode 140, the source electrode 150, and the drain electrode 160 form the thin-film transistor 300.

Referring to FIG. 6A, the gate insulation film 120 is disposed on the gate electrode 140, and the oxide semiconductor layer 130 is disposed on the gate insulation film 120. Referring to FIG. 6A, the gate electrode 140 is disposed so as to be closer to the substrate 110 than the oxide semiconductor layer 130 on the basis of the gate insulation film 120. In this case, hydrogen contained in the gate insulation film 120 may diffuse into the oxide semiconductor layer 130, whereby oxygen vacancy (O-vacancy) may occur in the oxide semiconductor layer 130, or the oxide semiconductor layer 130 may be conductivized.

In order to prevent the occurrence of oxygen vacancy in the oxide semiconductor layer 130 due to hydrogen or to prevent the oxide semiconductor layer 130 from being conductivized due to hydrogen, the oxide semiconductor layer 130 includes a first sub layer 131, which serves as a hydrogen-blocking layer. The first sub layer 131 is disposed to be in contact with the gate insulation film 120.

Figure 6B:
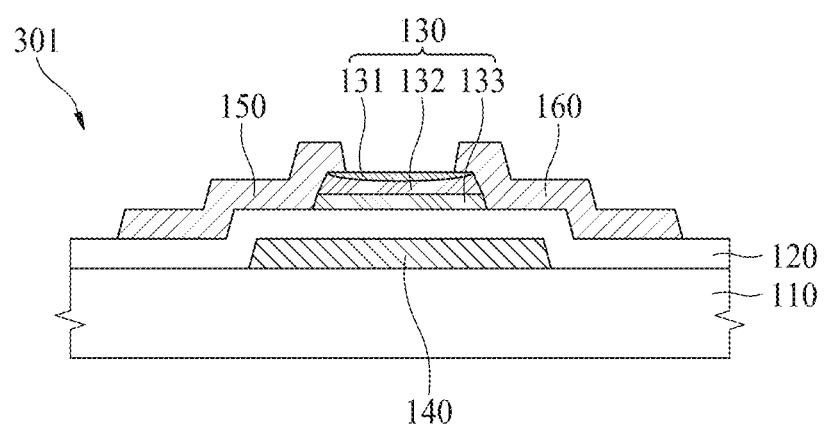

FIG. 6B is a cross-sectional view of a thin-film transistor 301 according to another aspect of the present disclosure. Compared to the oxide semiconductor layer 130 of the thin-film transistor 300 shown in FIG. 6A, the oxide semiconductor layer 130 of the thin-film transistor 301 shown in FIG. 6B is configured such that the first sub layer 131 and the third sub layer 133 are arranged in reverse order. Specifically, referring to FIG. 6A, the first sub layer 131, the second sub layer 132, and the third sub layer 133 are sequentially stacked from the gate insulation film 120. In contrast, referring to FIG. 6B, the third sub layer 133, the second sub layer 132, and the first sub layer 131 are sequentially stacked from the gate insulation film 120.

Figure 7A:
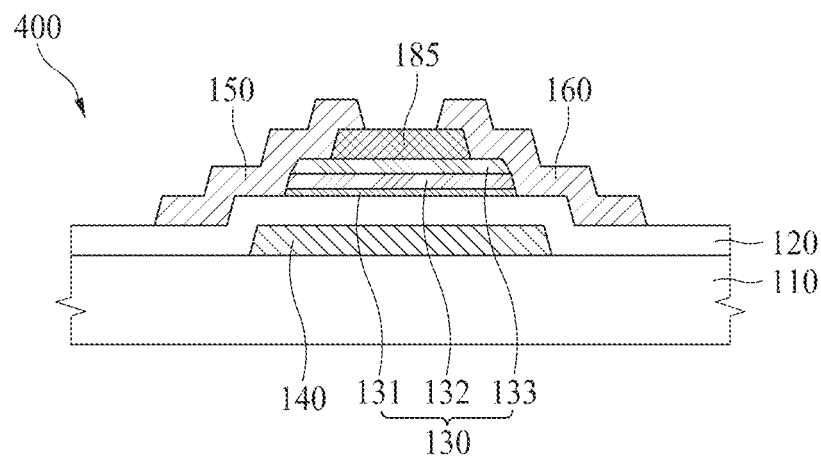
FIGS. 7A and 7B are cross-sectional views of thin-film transistors according to other aspects of the present disclosure.

FIG. 7A is a cross-sectional view of a thin-film transistor 400 according to another aspect of the present disclosure.

Compared to the thin-film transistor 300 shown in FIG. 6A, the thin-film transistor 400 shown in FIG. 7A further includes an etch stopper 185 disposed on the oxide semiconductor layer 130. The etch stopper 185 may be made of a insulation material. The etch stopper 185 may protect a channel region of the oxide semiconductor layer 130.

Figure 7B:
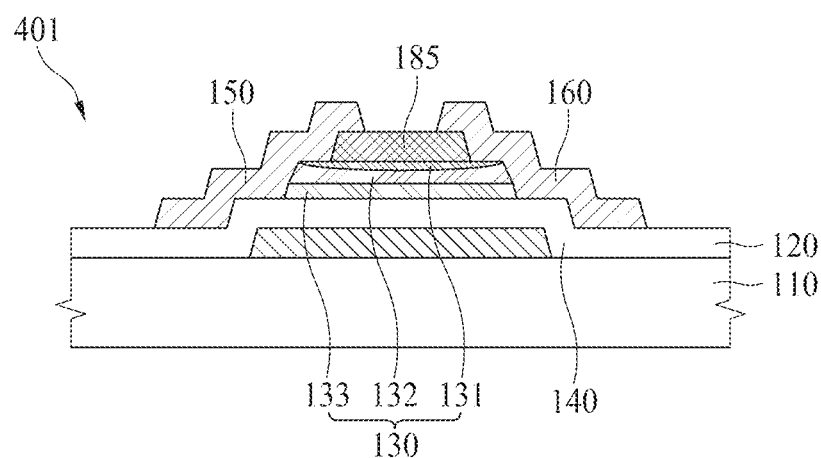

FIG. 7B is a cross-sectional view of a thin-film transistor 401 according to another aspect of the present disclosure. Compared to the oxide semiconductor layer 130 of the thin-film transistor 400 shown in FIG. 7A, the oxide semiconductor layer 130 of the thin-film transistor 401 shown in FIG. 7B is configured such that the first sub layer 131 and the third sub layer 133 are arranged in reverse order. Specifically, referring to FIG. 7A, the first sub layer 131, the second sub layer 132, and the third sub layer 133 are sequentially stacked from the gate insulation film 120. In contrast, referring to FIG. 7B, the third sub layer 133, the second sub layer 132, and the first sub layer 131 are sequentially stacked from the gate insulation film 120.

Figure 8:
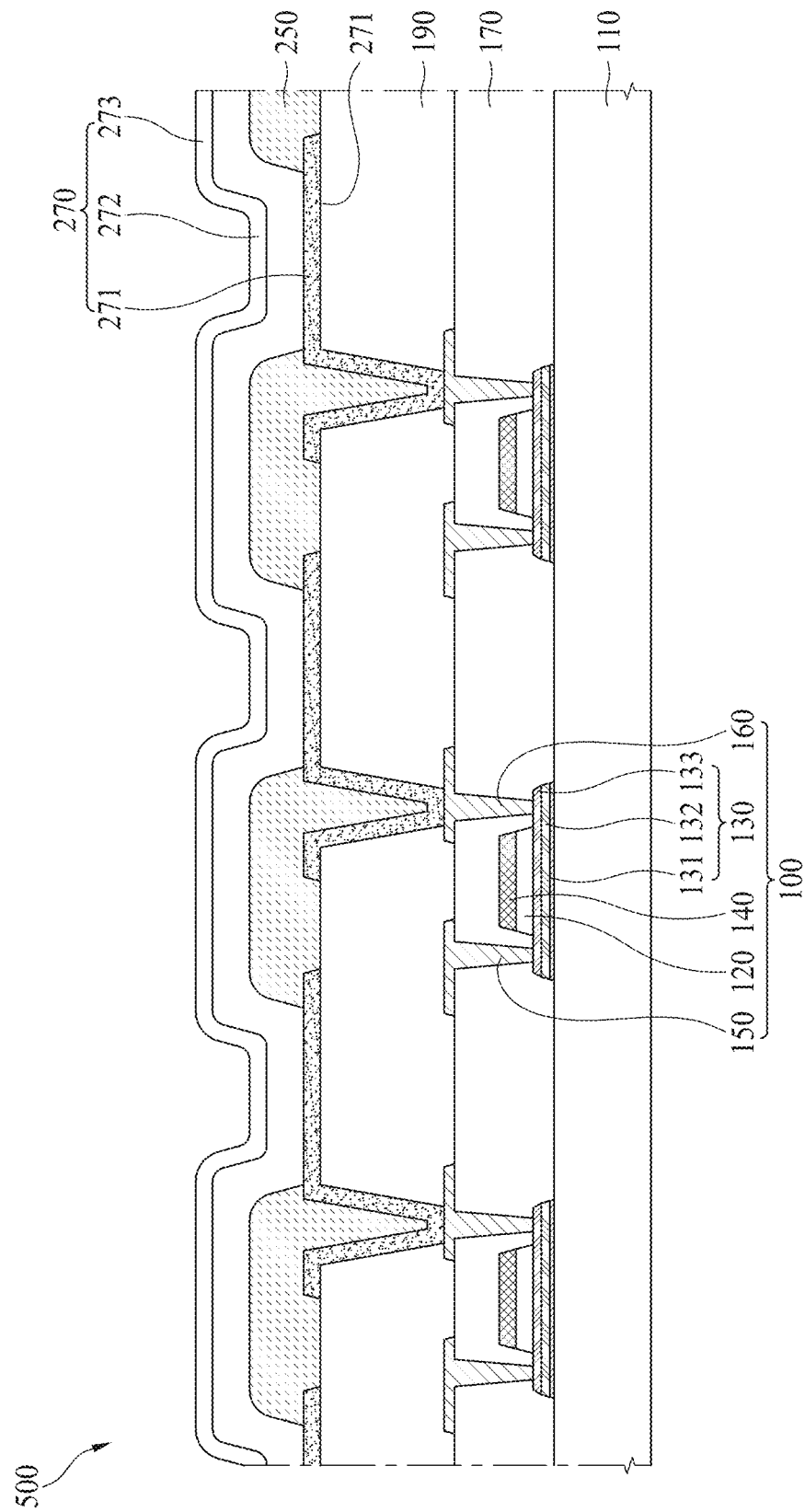
FIG. 8 is a schematic cross-sectional view of a display apparatus according to another aspect of the present disclosure.

FIG. 8 is a schematic cross-sectional view of a display apparatus 500 according to another aspect of the present disclosure.

The display apparatus 500 according to the aspect of the present disclosure includes a substrate 110, a thin-film transistor 100, and an organic light-emitting device 270 connected to the thin-film transistor 100.

The display apparatus 500 including the thin-film transistor 100 of FIG. 1 is shown in FIG. 8. However, the present disclosure is not limited thereto. The thin-film transistors 200, 300, 301, 400, and 401 shown in FIGS. 5, 6A, 6B, 7A, and 7B may be applied to the display apparatus 500 of FIG. 8.

Referring to FIG. 8, the display apparatus 500 includes a substrate 110, a thin-film transistor 100 disposed on the substrate 110, and a first electrode 271 connected to the thin-film transistor 100. In addition, the display apparatus 500 includes an organic layer 272 disposed on the first electrode 271 and a second electrode 273 disposed on the organic layer 272.

Specifically, the substrate 110 may be made of glass or plastic. In the case in which the substrate 110 is made of plastic, a flexible display apparatus may be manufactured. In this case, the substrate 110 may include at least one of polyimide (PI), polycarbonate (PC), polyethersulfone (PES), polyethylene naphthalate (PEN), polyethylene terephthalate (PET), or polystyrene (PS).

The thin-film transistor 100 is disposed on the substrate 110. The thin-film transistor 100 includes an oxide semiconductor layer 130, a gate electrode 140 disposed so as to overlap at least a portion of the oxide semiconductor layer 130 and isolated from the oxide semiconductor layer 130, a source electrode 150 connected to the oxide semiconductor layer 130, and a drain electrode 160 connected to the oxide semiconductor layer 130 and spaced apart from the source electrode 150. The oxide semiconductor layer 130 includes a first sub layer 131, a second sub layer 132 and a third sub layer 133, which are sequentially disposed. The first sub layer 131 serves as a hydrogen-blocking layer.

Referring to FIG. 8, a gate insulation film 120 is disposed between the gate electrode 140 and the oxide semiconductor layer 130.

A planarization film 190 is disposed on the thin-film transistor 100 in order to planarize the upper part of the substrate 110. The planarization film 190 may be composed of an organic insulation material that exhibits photosensitivity, such as an acrylic resin. However, the present disclosure is not limited thereto.

The first electrode 271 is disposed on the planarization film 190. The first electrode 271 is connected to the drain electrode 160 of the thin-film transistor 100 via a contact hole formed through the planarization film 190.

A bank layer 250 is disposed on the first electrode 271 and the planarization film 190 in order to define a pixel region or a light-emitting region. For example, the bank layer 250 may be disposed at the interface between pixels in a matrix fashion such that the pixel region can be defined by the bank layer 250.

The organic layer 272 is disposed on the first electrode 271. The organic layer 272 may be disposed on the bank layer 250. That is, the organic layer 272 may not be divided for each pixel, but may be continuous between adjacent pixels.

The organic layer 272 includes an organic light-emitting layer. The organic layer 272 may include a single organic light-emitting layer or two or more organic light-emitting layers that are stacked in the vertical direction. The organic layer 272 may emit any one of red, green, and blue light. Alternatively, the organic layer 272 may emit white light.

The second electrode 273 is disposed on the organic layer 272.

The first electrode 271, the organic layer 272, and the second electrode 273 may be stacked to form the organic light-emitting device 270. The organic light-emitting device 270 may serve as a light quantity adjustment layer in the display apparatus 500.

Although not shown, in the case in which the organic layer 272 emits white light, each pixel may include a color filter for filtering the white light emitted from the organic layer 272 for a corresponding wavelength. The color filter is disposed in a light movement path. In a so-called bottom-emission-type structure, in which light emitted from the organic layer 272 moves toward the substrate 110, which is disposed below the organic layer 272, the color filter is disposed below the organic layer 272. In a so-called top-emission-type structure, in which light emitted from the organic layer 272 moves toward the second electrode 273, which is disposed above the organic layer 272, the color filter is disposed above the organic layer 272.

Figure 9:
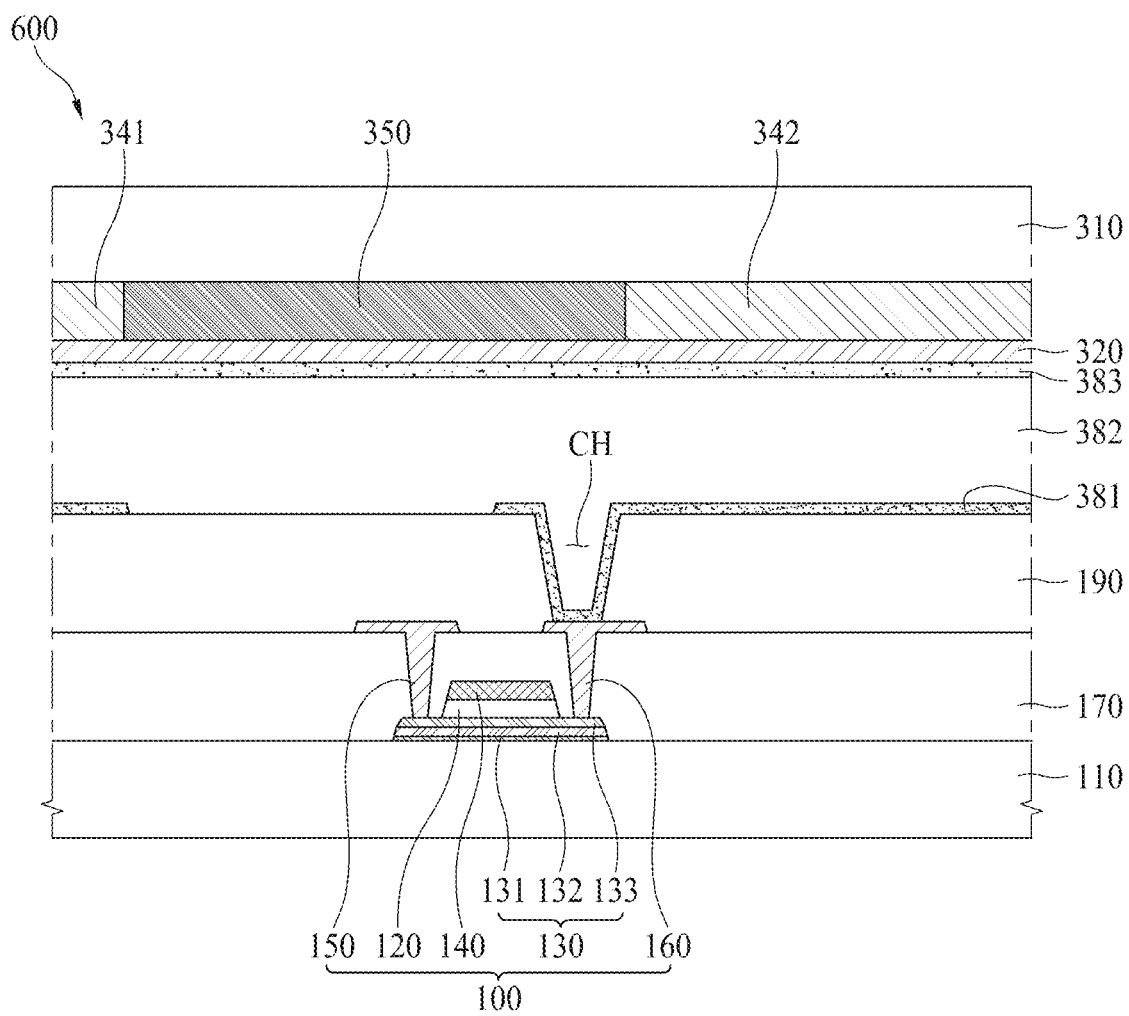
FIG. 9 is a schematic cross-sectional view of a display apparatus according to a further aspect of the present disclosure.

FIG. 9 is a schematic cross-sectional view of a display apparatus 600 according to a further aspect of the present disclosure.

Referring to FIG. 9, the display apparatus 600 according to the aspect of the present disclosure includes a substrate 110, a thin-film transistor 100 disposed on the substrate 110, and a first electrode 381 connected to the thin-film transistor 100. In addition, the display apparatus 600 includes a liquid crystal layer 382 disposed on the first electrode 381 and a second electrode 383 disposed on the liquid crystal layer 382.

The liquid crystal layer 382 serves as a light quantity adjustment layer. As described above, the display apparatus 600 shown in FIG. 9 is a liquid crystal display apparatus including a liquid crystal layer 382.

Specifically, the display apparatus 600 of FIG. 9 includes a substrate 110, a thin-film transistor 100, a planarization film 190, a first electrode 381, a liquid crystal layer 382, a second electrode 383, a barrier layer 320, color filters 341 and 342, a light-blocking unit 350, and an opposite substrate 310.

The substrate 110 may be made of glass or plastic.

Referring to FIG. 9, the thin-film transistor 100 is disposed on the substrate 110. The thin-film transistor 100 includes an oxide semiconductor layer 130, a gate electrode 140 disposed so as to overlap at least a portion of the oxide semiconductor layer 130 and isolated from the oxide semiconductor layer 130, a source electrode 150 connected to the oxide semiconductor layer 130, and a drain electrode 160 connected to the oxide semiconductor layer 130 and spaced apart from the source electrode 150.

The oxide semiconductor layer 130 includes a first sub layer 131, a second sub layer 132 and a third sub layer 133, which are sequentially disposed. Specifically, the oxide semiconductor layer 130 includes a first sub layer 131, a second sub layer 132 disposed on the first sub layer 131, and a third sub layer 133 disposed on the second sub layer 132. In addition, referring to FIG. 9, a gate insulation film 120 is disposed between the gate electrode 140 and the oxide semiconductor layer 130.

The planarization film 190 is disposed on the thin-film transistor 100 in order to planarize the upper part of the substrate 110.

The first electrode 381 is disposed on the planarization film 190. The first electrode 381 is connected to the drain electrode 160 of the thin-film transistor 100 via a contact hole CH formed through the planarization film 190.

The opposite substrate 310 is disposed so as to be opposite the substrate 110.

The light-blocking unit 350 is disposed on the opposite substrate 310. The light-blocking unit 350 has a plurality of openings therein. The openings are disposed so as to correspond to first electrodes 381, which are pixel electrodes. The light-blocking unit 350 blocks the transmission of light through the remaining portion thereof excluding the openings. The light-blocking unit 350 is not essential, and thus may be omitted.

The color filters 341 and 342 are disposed on the opposite substrate 310, and selectively block the wavelength of light incident from a backlight unit (not shown). Specifically, the color filters 341 and 342 may be disposed in the openings defined by the light-blocking unit 350. Each of the color filters 341 and 342 may express any one of red, green, and blue. Each of the color filters 341 and 342 may express a color other than red, green, or blue.

The barrier layer 320 may be disposed on the color filters 341 and 342 and the light-blocking unit 350. The barrier layer 320 may be omitted.

The second electrode 383 is disposed on the barrier layer 320. For example, the second electrode 383 may be disposed in front of the opposite substrate 310. The second electrode 383 may be composed of a transparent conductive material, such as ITO or IZO.

The first electrode 381 and the second electrode 383 are disposed so as to be opposite each other, and the liquid crystal layer 382 is disposed between the first electrode 381 and the second electrode 383. The second electrode 383 applies an electric field to the liquid crystal layer 382 together with the first electrode 381.

On the assumption that the surfaces of the substrate 110 and the opposite substrate 310 that face each other between the substrate 110 and the opposite substrate 310 are defined as upper surfaces of the substrate 110 and the opposite substrate 310 and the surfaces of the substrate 110 and the opposite substrate 310 that are opposite the upper surfaces thereof are defined as lower surfaces of the substrate 110 and the opposite substrate 310, a polarizing plate may be disposed on each of the lower surfaces of the substrate 110 and the opposite substrate 310.

Hereinafter, the present disclosure will be described in more detail with reference to Examples, Comparative Examples, and Experimental Examples.

Examples 1 to 3 and Comparative Examples 1 to 4

A thin film for forming a bulk layer 130B, having a thickness of 30 nm, was formed on a plastic substrate 110 made of polyimide (PI) by sputter deposition, a thin film for forming a third sub layer 133, having a thickness of 30 nm, was formed on the thin film for forming the bulk layer 130B, and the thin film for forming the bulk layer 130B and the thin film for forming the third sub layer 133 were patterned in order to form a bulk layer 130B and a third sub layer 133. Subsequently, the bulk layer 130B and the third sub layer 133 were heat-treated. As a result, an oxide semiconductor layer 130 was manufactured.

Here, the third sub layer 133 was composed of an InGaZnO (IGZO)-based oxide semiconductor material including indium (In), gallium (Ga), and zinc (Zn) mixed at a ratio of 1:1:1 based on the number of atoms. The bulk layer 130B also included indium (In), gallium (Ga), and zinc (Zn). In the bulk layer 130B, however, indium (In), gallium (Ga), and zinc (Zn) were mixed at different ratios based on the number of atoms, as shown in Table 1 below. Thin-film transistors were manufactured according to the composition shown in Table 1 (Examples 1 to 3 and Comparative Examples 1 to 4).

TABLE 1

| Classification | Bulk layer (In:Ga:Zn) | Third sub layer (In:Ga:Zn) |
| --- | --- | --- |
| Example 1 | 1:3:2 | 1:1:1 |
| Example 2 | 1:3:3 | 1:1:1 |
| Example 3 | 1:3:4 | 1:1:1 |
| Comparative Example 1 | 4:1:4 | 1:1:1 |

TABLE 1-continued

| Classification | Bulk layer (In:Ga:Zn) | Third sub layer (In:Ga:Zn) |
| --- | --- | --- |
| Comparative Example 2 | 1:1:1 | 1:1:1 |
| Comparative Example 3 | 1:2:1 | 1:1:1 |
| Comparative Example 4 | 1:3:1 | 1:1:1 |

Experimental Example 1

Measurement of C-Axis Crystallinity

Figure 10A:
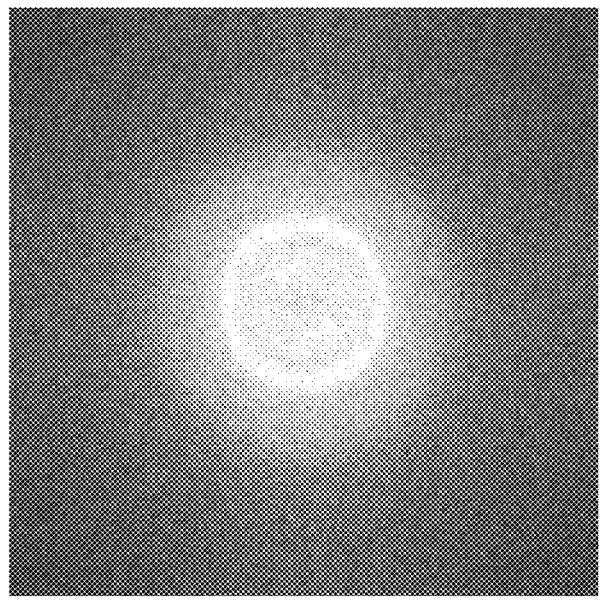
FIGS. 10A and 10B are transmission electron microscope (TEM) photographs respectively showing a third sub layer and a bulk layer.
Figure 10B:
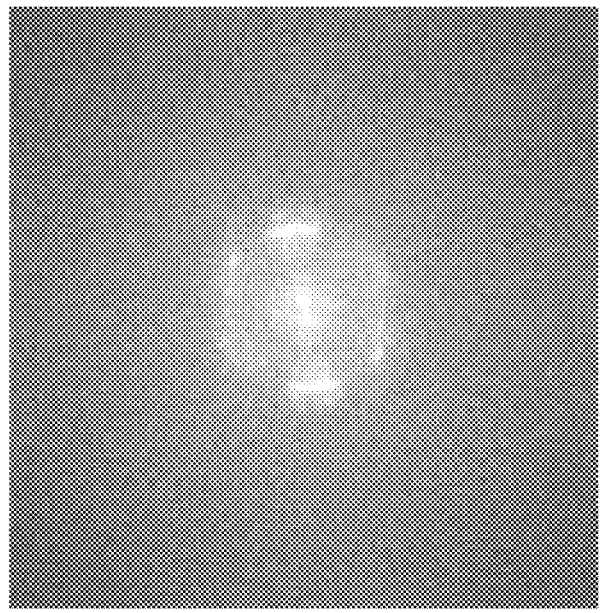

Photographs of the third sub layer 133 and the bulk layer 130B of the oxide semiconductor layer according to Example 1 were taken using a transmission electron microscope (TEM) in order to check the crystallinity of the third sub layer 133 and the bulk layer 130B. FIGS. 10A and 10B are transmission electron microscope (TEM) photographs respectively showing the third sub layer 133 and the bulk layer 130B.

Referring to FIG. 10A, it can be seen that the third sub layer 133 has no crystallinity. On the other hand, referring to FIG. 10B, it can be seen that the bulk layer 130B has C-axis-oriented crystallinity.

Experimental Example 2

Taper Shape

The taper shape of the edge of each of the third sub layer 133 and the bulk layer 130B of each of the oxide semiconductor layers according to Example 1 and Comparative Example 1 was checked using the transmission electron microscope.

Figure 11A:
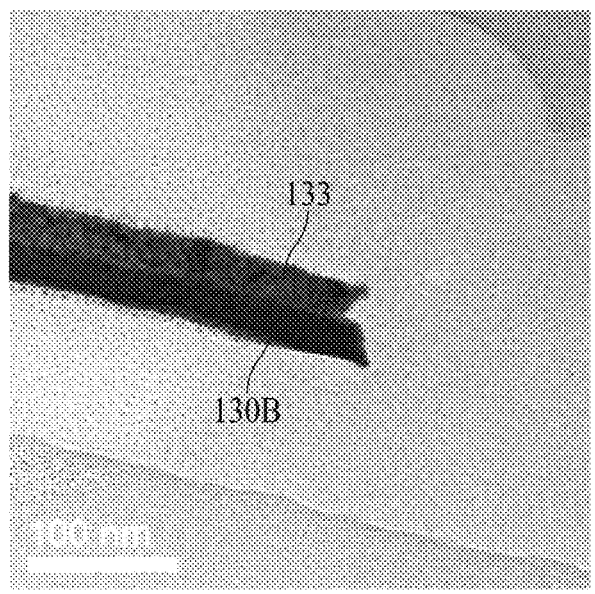
FIGS. 11A and 11B are transmission electron microscope (TEM) photographs respectively showing taper shapes formed at oxide semiconductor layers according to Comparative Example 1 and Example 1.
Figure 11B:
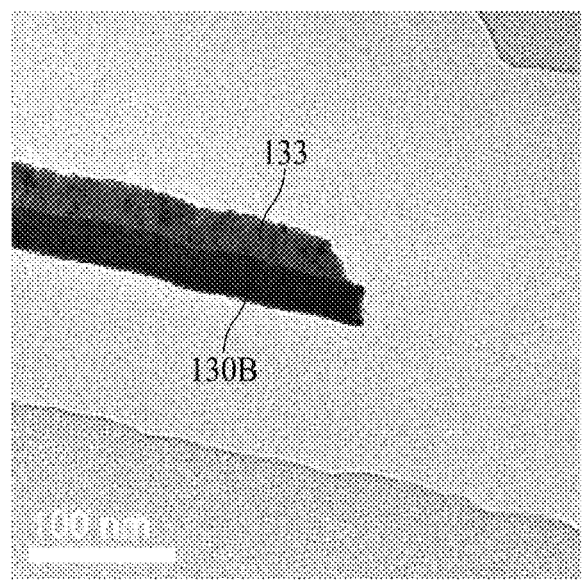

FIGS. 11A and 11B are transmission electron microscope photographs respectively showing taper shapes formed at the oxide semiconductor layers according to Comparative Example 1 and Example 1.

Referring to FIG. 11A, an inverse-taper-shaped end was formed at the edge of the third sub layer 133 of the oxide semiconductor layer according to Comparative Example 1. It is determined that the inverse-taper-shaped edge was formed as the result of excessive etching at the interface between the third sub layer 133 and the bulk layer 130B due to the fast speed at which the bulk layer 130 was etched.

On the other hand, referring to FIG. 11B, it can be seen that a forward-taper-shaped end was formed at the edge of each of the bulk layer 130B and the third sub layer 133 of the oxide semiconductor layer 130 according to Example 1.

Experimental Example 3

Measurement of Hydrogen Content

The content of hydrogen in each of the oxide semiconductor layers according to Examples 1 to 3 based on the depth thereof was measured using a dynamic secondary ion mass spectrometer (D-SIMS). The D-SIMS is an apparatus that introduces primary ions having a predetermined amount of energy into the surface of a solid body and analyzes secondary ions discharged from the surface of the solid body in order to analyze atoms or molecules constituting the surface of the solid body.

Specifically, the surface of each of the oxide semiconductor layers according to Examples 1 to 3 was etched while a predetermined amount of energy was applied to the surface of each of the oxide semiconductor layers, and ions discharged from the surface of each of the oxide semiconductor layers were analyzed using a CAMECA IMS 7f-Auto, which is a kind of D-SIMS, in order to measure the content of hydrogen in each of the oxide semiconductor layers based on the depth thereof (Model: 7f-Auto (CAMECA), Source: Cs 10 keV, Sample: −5 keV, Primary Current: 10 nA, Raster: 100 μm). The results are shown in FIG. 12.

Figure 12:
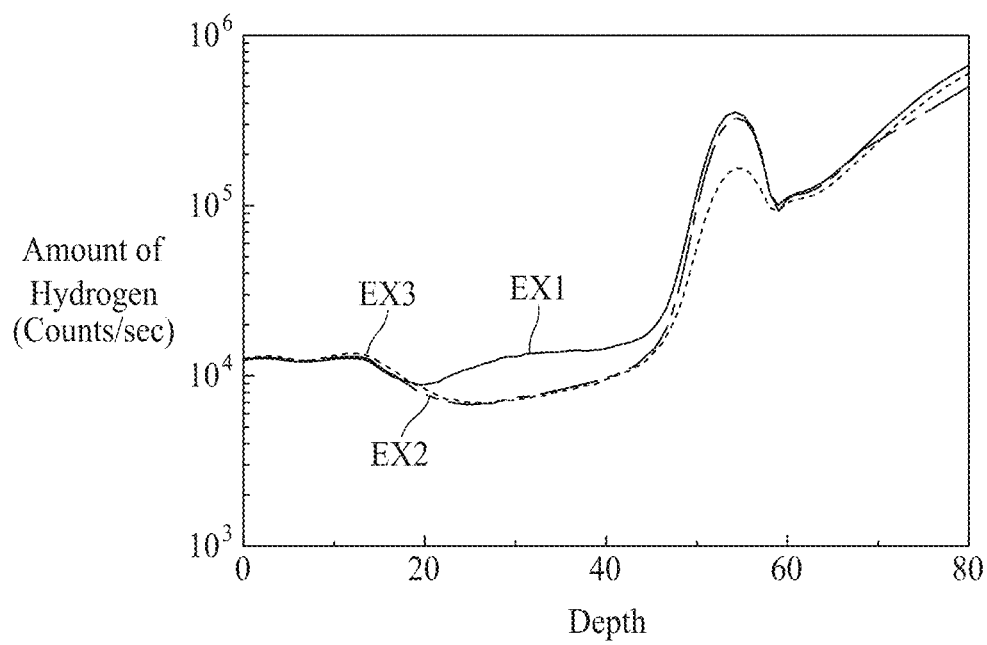
FIG. 12 is a graph showing the content of hydrogen in each oxide semiconductor layer based on the depth thereof.

FIG. 12 is a graph showing the content of hydrogen in each of the oxide semiconductor layers based on the depth thereof. In FIG. 12, the terms "EX1", "EX2", and "EX3" indicate Example 1, Example 2, and Example 3, respectively.

In the graph shown in FIG. 12, the horizontal axis indicates the depth, and the vertical axis indicates the number of hydrogen atoms detected per unit of time (second; sec), which corresponds to the concentration of hydrogen.

In the graph shown in FIG. 12, a depth range of 0 to 30 nm corresponds to the third sub layer 133, a depth range of 30 to 47 nm corresponds to the second sub layer 132, and a depth range of 47 to 60 nm corresponds to the first sub layer 131. Referring to FIG. 12, it can be seen from Examples 1 to 3 that hydrogen (H) discharged from the substrate 110 was introduced into the lower part of the bulk layer 130B, whereby the first sub layer 131 was formed.

Specifically, referring to FIG. 12, it can be seen that the concentration of hydrogen in the first sub layer 131 is high, that the concentration of hydrogen in the first sub layer 131 is abruptly reduced toward the second sub layer 132, and that the concentration of hydrogen in the third sub layer 133 remains low. The concentration of hydrogen in the third sub layer 133 is less than 1/10 of the concentration of hydrogen in the first sub layer 131. It can be seen from the above results that the first sub layer 131 exhibits excellent hydrogen-blocking ability.

Figure 13:
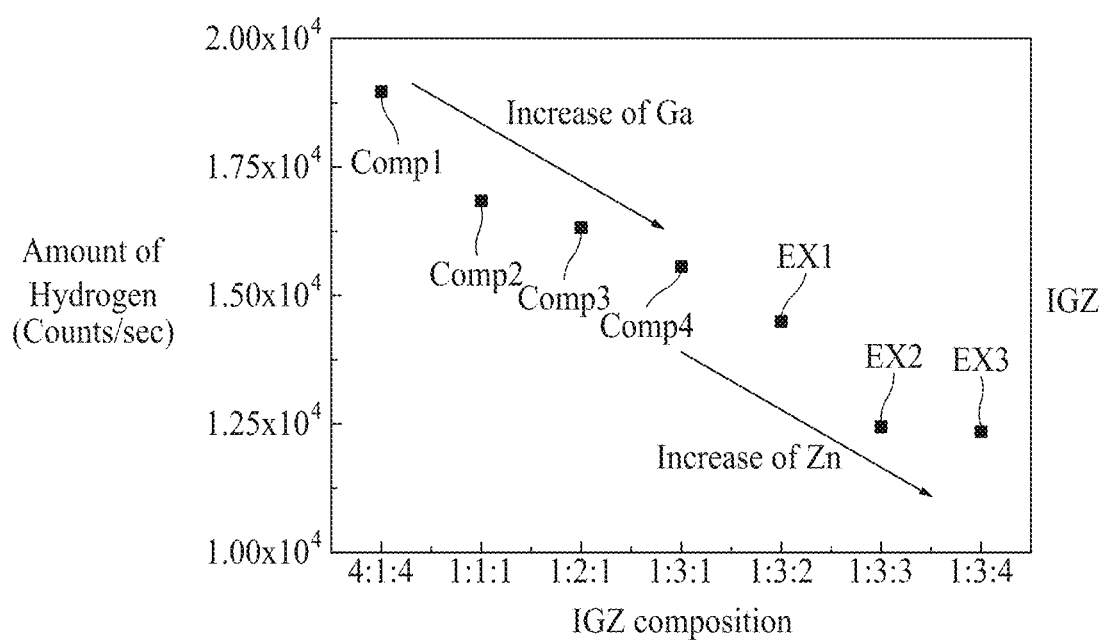
FIG. 13 is a graph showing the average content of hydrogen contained in a third sub layer of each of oxide semiconductor layers according to Comparative Examples 1 to 4 and Examples 1 to 3.

FIG. 13 is a graph showing the average content of hydrogen contained in the third sub layer 133 of each of the oxide semiconductor layers 130 according to Comparative Examples 1 to 4 and Examples 1 to 3. In FIG. 13, the terms "EX1", "EX2", and "EX3" indicate Example 1, Example 2, and Example 3, respectively. In addition, the terms "Comp1", "Comp2", "Comp3", and "Comp4" indicate Comparative Example 1, Comparative Example 2, Comparative Example 3, and Comparative Example 4, respectively.

Referring to FIG. 13, it can be seen that the average content of hydrogen contained in the third sub layer 133 of each of the oxide semiconductor layers according to Examples 1 to 3 is less than the average content of hydrogen contained in the third sub layer 133 of each of the oxide semiconductor layers according to Comparative Examples 1 to 4.

It can be seen from the above results that, in each of the oxide semiconductor layers according to Examples 1 to 3, hydrogen discharged from the substrate by heat treatment performed at a temperature of 300° C. was introduced into the lower part of the bulk layer 130B, whereby the first sub layer 131, which is a hydrogen-blocking layer, was formed.

A thin-film transistor including an oxide semiconductor layer 130 according to an aspect of the present disclosure exhibits excellent reliability and driving properties. In addition, a display apparatus according to an aspect of the present disclosure including such a thin-film transistor may have excellent reliability while having a small thickness.

As is apparent from the above description, a thin-film transistor according to an aspect of the present disclosure includes a hydrogen-blocking layer that exhibits an excellent hydrogen-blocking property. Even in the case in which an oxide semiconductor layer is formed on a plastic substrate, such as one made of a polyimide (PI), the oxide semiconductor layer is not damaged, whereby the thin-film transistor exhibits excellent reliability. Since the thin-film transistor exhibits excellent reliability even on a plastic substrate, the thin-film transistor may be usefully used to manufacture a flexible display apparatus.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin-film transistor comprising:
   a plastic substrate;
   an oxide semiconductor layer disposed on the plastic substrate and including a first sub layer, a second sub layer and a third sub layer, the second sub layer disposed between the first sub layer and the third sub layer;
   a gate electrode isolated from the oxide semiconductor layer, the gate electrode overlapping at least a portion of the oxide semiconductor layer;
   an interlayer insulation film on the gate electrode;
   a source electrode on the interlayer insulation film, the source electrode contacting an upper surface of the third sub layer of the oxide semiconductor layer through a contact hole; and
   a drain electrode on the interlayer insulation film, the drain electrode being spaced apart from the source electrode and contacting the upper surface of the third sub layer of the oxide semiconductor layer through another contact hole,
   wherein the second sub layer has a resistance larger than that of the first sub layer and that of the third sub layer, and a carrier concentration lower than that of the first sub layer and that of the third sub layer,
   the first sub layer has a hydrogen concentration higher than that of the second sub layer and the third sub layer,
   each of the first sub layer and the second sub layer has crystallinity,
   the second sub layer has a thickness equivalent to 2 to 5 times a thickness of the first sub layer,
   the third sub layer has a first conductivized portion at a region thereof that does not overlap with the gate electrode,
   the second sub layer has a second conductivized portion at a region thereof that does not overlap with the gate electrode to contact the first conductivized portion,
   the second conductivized portion does not contact the first sub layer, and
   wherein the first sub layer of the oxide semiconductor layer contacts the plastic substrate.

2. The thin-film transistor according to claim 1, wherein each of the first sub layer and the second sub layer has C-axis crystallinity and a wurtzite crystal structure.

3. The thin-film transistor according to claim 1, wherein the first sub layer and the second sub layer have a same metal element composition.

4. The thin-film transistor according to claim 1, wherein the third sub layer has no C-axis crystallinity.

5. The thin-film transistor according to claim 1, wherein
each of the first sub layer, the second sub layer, and the third sub layer includes indium (In), gallium (Ga), and zinc (Zn), and
the third sub layer has an indium (In) concentration higher than that of the first sub layer and the second sub layer.

6. The thin-film transistor according to claim 5, wherein a content of indium (In), gallium (Ga), and zinc (Zn) in each of the first sub layer and the second sub layer satisfies Equations 1 and 2 below, $$2 \leq [Ga]/[In] \leq 4 \quad \text{[Equation 1]}$$

$$2 \leq [Zn]/[In] \leq 6 \quad \text{[Equation 2]}$$

in Equations 1 and 2, [Ga] indicates a number of atoms in gallium (Ga), [In] indicates a number of atoms in indium (In), and [Zn] indicates a number of atoms in zinc (Zn).

7. The thin-film transistor according to claim 5, wherein the third sub layer has a zinc (Zn) concentration and a gallium (Ga) concentration lower than those of the first sub layer and those of the second sub layer.

8. The thin-film transistor according to claim 5, wherein a zinc (Zn) concentration is higher than an indium (In) concentration in each of the first sub layer and the second sub layer.

9. The thin-film transistor according to claim 1, wherein the first sub layer has a taper angle larger than the third sub layer.

10. The thin-film transistor according to claim 1, wherein the third sub layer is disposed to the gate electrode closer than the first sub layer.

11. The thin-film transistor according to claim 10, wherein the first sub layer is disposed to the plastic substrate closer than the third sub layer on a basis of the second sub layer.

12. The thin-film transistor according to claim 1, wherein the first sub layer has a hydrogen concentration equivalent to or more than 10 times a hydrogen concentration of the second sub layer.

13. A display apparatus comprising:
a plastic substrate;
a thin-film transistor on the plastic substrate; and
a first electrode connected to the thin-film transistor,
wherein the thin-film transistor comprises,
an oxide semiconductor layer on the plastic substrate, the oxide semiconductor layer including a first sub layer, a second sub layer and a third sub layer, the second sub layer disposed between the first sub layer and the third sub layer;
a gate electrode isolated from the oxide semiconductor layer, the gate electrode overlapping at least a portion of the oxide semiconductor layer;
an interlayer insulation film on the gate electrode;
a source electrode on the interlayer insulation film, the source electrode contacting an upper surface of the third sub layer of the oxide semiconductor layer through a contact hole; and
a drain electrode on the interlayer insulation film, the drain electrode being spaced apart from the source electrode and contacting the upper surface of the third sub layer of the oxide semiconductor layer through another contact hole, and
wherein the second sub layer has a resistance larger than that of the first sub layer and that of the third sub layer, and a carrier concentration lower than that of the first sub layer and that of the third sub layer,
the first sub layer has a hydrogen concentration higher than the second sub layer and the third sub layer,
each of the first sub layer and the second sub layer has crystallinity,
the second sub layer has a thickness equivalent to 2 to 5 times a thickness of the first sub layer,
the third sub layer has a first conductivized portion at a region thereof that does not overlap with the gate electrode,
the second sub layer has a second conductivized portion at a region thereof that does not overlap with the gate electrode to contact the first conductivized portion,
the second conductivized portion does not contact the first sub layer, and
wherein the first sub layer of the oxide semiconductor layer contacts the plastic substrate.

14. The display apparatus according to claim 13, wherein each of the first sub layer and the second sub layer has C-axis crystallinity and a wurtzite crystal structure.

15. The thin-film transistor according to claim 1, wherein the plastic substrate comprises at least one selected from polyimide, polycarbonate, polyethersulfone, polyethylene naphthalate, polyethylene terephthalate and polystyrene.

16. A thin-film transistor comprising:
a plastic substrate;
an oxide semiconductor layer disposed on the plastic substrate and including a first sub layer, a second sub layer and a third sub layer, the second sub layer disposed between the first sub layer and the third sub layer,
wherein the second sub layer has a resistance larger than that of the first sub layer and that of the third sub layer, and a carrier concentration lower than that of the first sub layer and that of the third sub layer,
the first sub layer has a hydrogen concentration higher than that of the second sub layer and the third sub layer,
each of the first sub layer and the second sub layer has crystallinity,
the second sub layer has a thickness equivalent to 2 to 5 times a thickness of the first sub layer,
the third sub layer has a first conductivized portion at a region thereof that does not overlap the gate electrode,
the second sub layer has a second conductivized portion at a region thereof that does not overlap the gate electrode to contact the first conductivized portion,
the second conductivized portion does not contact the first sub layer, and
wherein the first sub layer of the oxide semiconductor layer contacts the plastic substrate.

* * * * *